United States Patent [19]

Mounteer et al.

[11] 4,287,772
[45] Sep. 8, 1981

[54] STRAIN GAGE TRANSDUCER AND PROCESS FOR FABRICATING SAME

[75] Inventors: Carlyle A. Mounteer, Irvine; Ronald L. Poteet, San Juan Capistrano, both of Calif.

[73] Assignee: Gulton Industries, Inc., Metuchen, N.J.

[21] Appl. No.: 72,064

[22] Filed: Sep. 4, 1979

Related U.S. Application Data

[62] Division of Ser. No. 906,955, May 18, 1978, Pat. No. 4,188,258.

[51] Int. Cl.³ .............................................. G01L 9/04
[52] U.S. Cl. ....................................... 73/720; 73/726; 338/4
[58] Field of Search .................. 73/720, 726, 141 A, 73/777; 338/4, 5

[56] References Cited

U.S. PATENT DOCUMENTS

| | | | |
|---|---|---|---|
| 3,341,794 | 9/1967 | Stedman | 73/720 |
| 3,513,430 | 5/1970 | Heller | 338/4 |
| 3,913,391 | 10/1975 | Kurtz | 73/777 |
| 3,922,705 | 11/1975 | Yerman | 73/726 |

Primary Examiner—Anthony V. Ciarlante
Attorney, Agent, or Firm—Blakely, Sokoloff, Taylor & Zafman

[57] ABSTRACT

A transducer which includes a metal strain gage material formed on a flexible monocrystalline silicon diaphragm is disclosed. The transducer is fabricated to a large extent with semiconductor processing steps. Gold is diffused into a platinum-tungsten gage material. This allows the gage material to be chemically etched in the presence of other metals to define the active gage resistors. In the presently preferred embodiment, these resistors are formed over thin areas of the diaphragm to provide increased linearity and sensitivity.

5 Claims, 11 Drawing Figures

SENSOR SUBSTRATE (TOP)

SENSOR SUBSTRATE (BOTTOM)

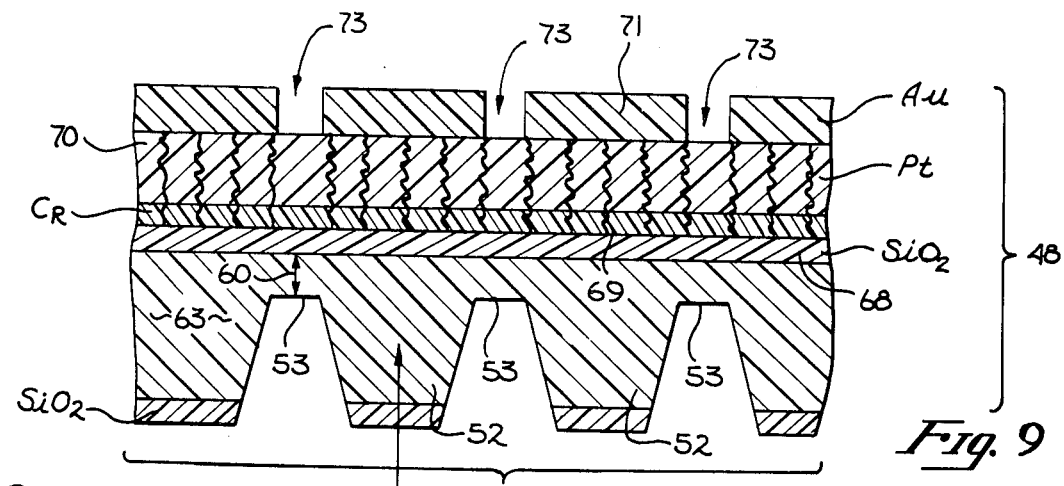
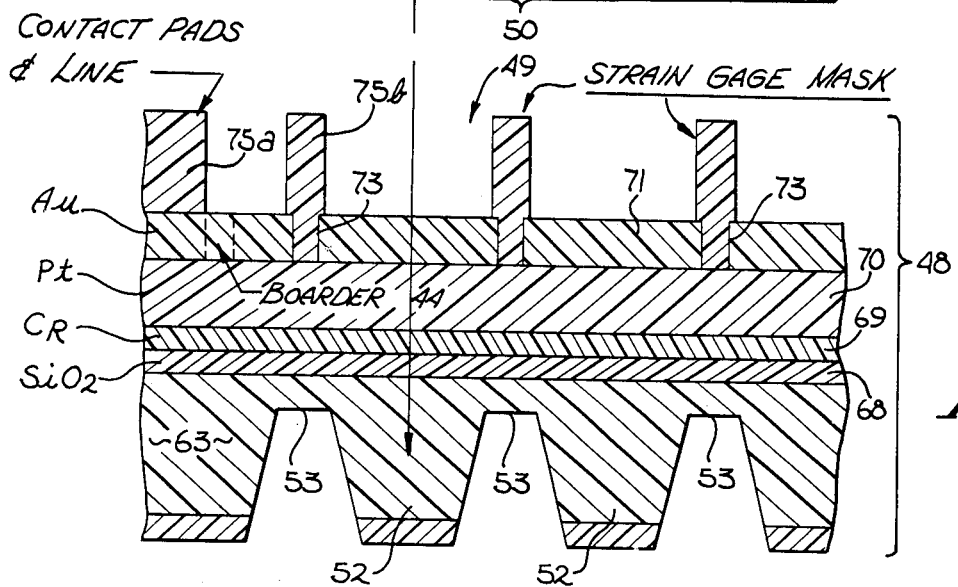
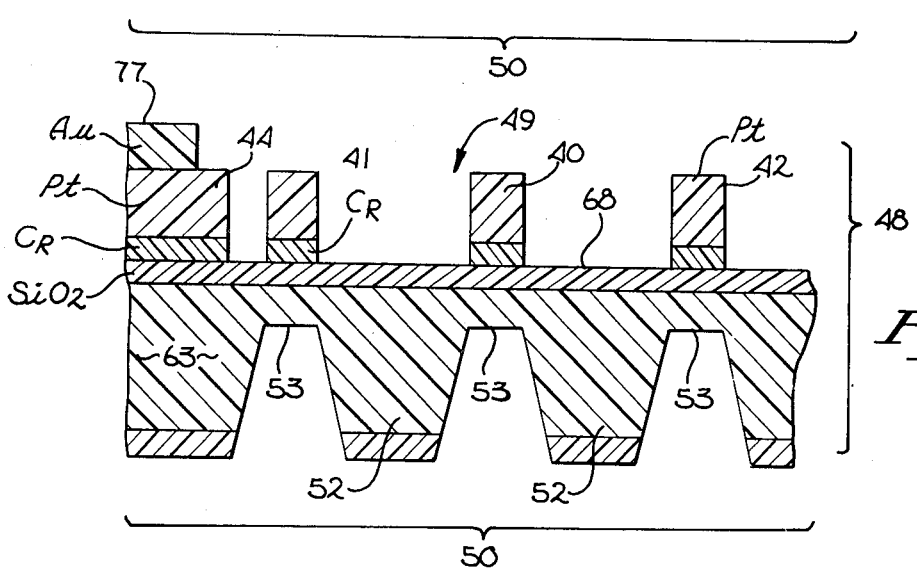

STRAIN GAGE TRANSDUCER AND PROCESS FOR FABRICATING SAME

This is a division of application Ser. No. 906,955, filed May 18, 1978 now U.S. Pat. No. 4,188,258, issued Feb. 12, 1980.

BACKGROUND OF THE INVENTION

1. Field of the Invention

The invention relates to the field of transducers of the strain gage type.

2. Prior Art

It is well-known to fabricate pressure transducers by defining patterns or regions of materials having strain gage characteristics on a flexible diaphragm. For the most part, commercial embodiments of these transducers are either diffused regions in a monocrystalline diaphragm or thin films on a metal or other diaphragm.

The semiconductor approach to these transducers (diffused regions in a monocrystalline substrate/diaphragm) has the advantage of using well-developed semiconductor processing. This processing includes such steps as growing oxide layers, chemically depositing layers, masking, and chemical and plasma etching. These steps allow the simultaneous fabrication of many identical transducers and compensating circuits, including active networks on the same substrate at a relatively low cost. For an example of such fabrication, see U.S. Pat. Nos. 3,764,950 and 4,033,787. These devices, however, have some drawbacks. The current density in the doped regions can be sufficiently high to cause continued diffusion of the dopant into the substrate which changes the properties of the gage. The deflection of the substrate causes relocation of crystal faults which influences carrier mobility. Ions trapped in junctions cause conductivity changes which also affect stability.

Thin film metal strain gage materials do not exhibit instabilities due to these effects. However, the fabrication process, such as electroplating and electroetching, are more expensive than the semiconductor processing techniques and do not lend themselves to the high volume processing techniques used in semiconductor wafer processing.

In some cases, a concentric boss is included on the diaphragm so as to confine most of the deflection to the outer portion of the diaphragm. This improves the linearity and sensitivity of the transducer. (See U.S. Pat. No. 3,341,794.) This same result is obtained by forming the active strain gage resistors over thinner sections of a diaphragm (beam) such as shown in U.S. Pat. No. 3,520,191.

As will be seen, the transducer of the present invention has the performance advantages of the thin film-type transducers, and the processing advantages of the semiconductor-type transducers. The present invention also provides a process which allows platinum to be etched in the presence of other metals.

SUMMARY OF THE INVENTION

A transducer operating on the strain gage principle is disclosed. In the presently preferred embodiment, the active gage resistors are formed in a Wheatstone bridge circuit configuration on a monocrystalline silicon diaphragm. The platinum-tungsten gage material is separated from the semiconductor substrate by a silicon dioxide layer. The gage resistors are formed over thin areas of the substrate to improve linearity and sensitivity.

A gold layer is formed on the platinum layer. An ordinary masking step and etching step are used to define the pattern of the gage resistors in this gold layer. Then gold from this layer is diffused into the platinum layer. The platinum layer may now be chemically etched and is etched to define the platinum gage resistors and gold/platinum lines and contact pads.

BRIEF DESCRIPTION OF THE DRAWINGS

FIG. 9 illustrates the substrate of FIG. 8 after masking, etching and diffusion steps have been performed on the upper surface and after mesas have been etched into the lower surface.

FIG. 10 illustrates the substrate of FIG. 9 after an additional masking step; and FIG. 11 illustrates the substrate of FIG. 10 after an additional etching step.

DETAILED DESCRIPTION OF THE INVENTION

A transducer of the strain gage type is disclosed. A metal alloy gage material is etched into the configuration of a Wheatstone bridge on a monocrystalline silicon substrate, which substrate acts as a diaphragm.

In the following discription, numerous specific details are set forth, such as specific thicknesses and other dimensions, to provide a thorough understanding of the present invention. It will, however, be obvious to one skilled in the art that the inventive concepts disclosed in this application may be practiced without employing these specific details. In other instances, well-known structures and processes, such as masking and etching steps, are not described in detail in order not to obscure the present invention in unnecessary detail.

Figure 7:
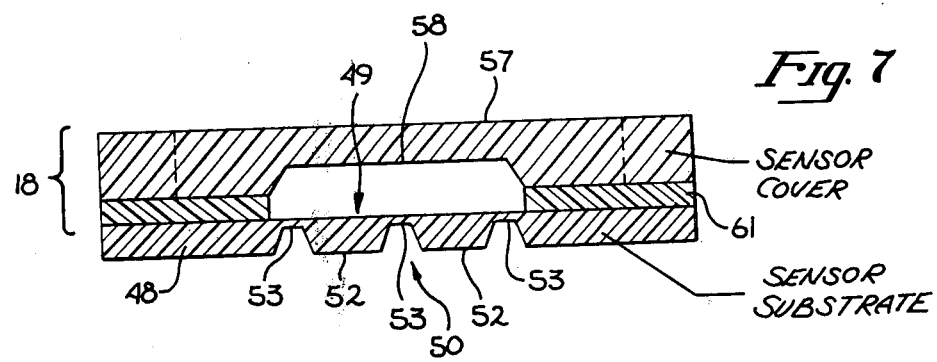
FIG. 7 is a cross-sectional elevation view of the sensor assembly which includes the sensor and its cover.

First referring to FIG. 7, the sensor assembly 18 of the transducer includes a sensor 48 and a sensor cover 57. The active strain gage resistors of the sensor are fabricated on the surface 49 of the sensor 48 and are hermetically sealed (in a vacuum) within the recess 58 of the silicon sensor cover 57. A glass sealant 61 provides the seal between the sensor 48 and cover 57. The surface 50 of sensor 48 is etched to define a plurality of mesas 52 which form the thinner substrate areas 53. As will be explained in greater detail, the strain gage resistors are formed over the thinner areas 53 (on surface 49) to improve the linearity and sensitivity of the transducer.

Figure 3:
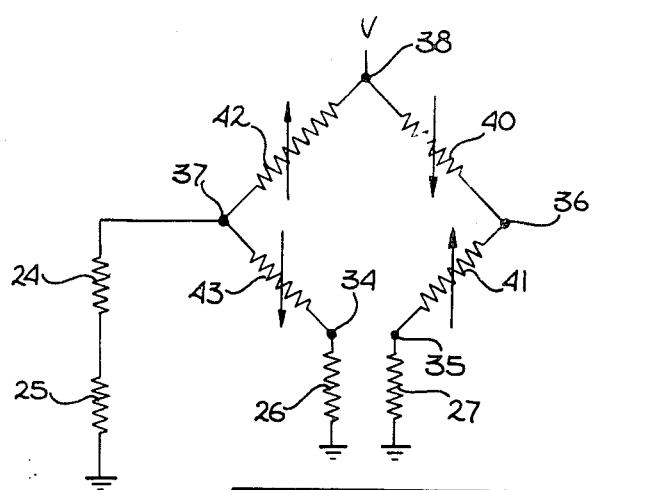
FIG. 3 is an electrical schematic of the invented transducer showing the general Wheatstone bridge resistor configuration of the transducer sensor and the external calibration resistors which are mounted within the package of FIGS. 1 and 2.
Figure 4:
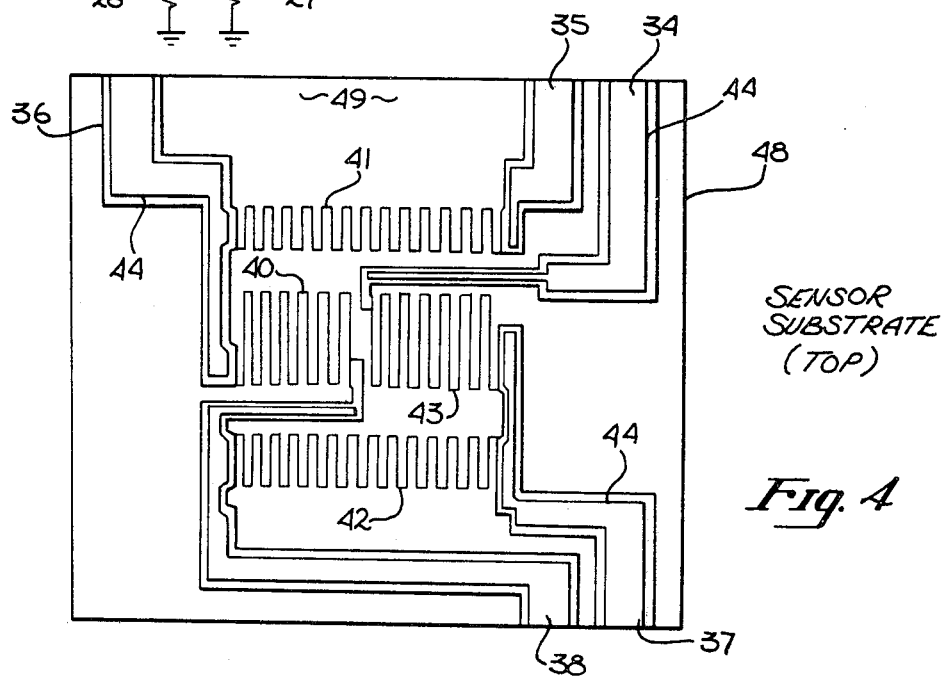
FIG. 4 is a plan view illustrating the top surface of the sensor of the invented transducer.

The surface 49 of sensor 48, as best seen in FIG. 4, includes four active strain gage resistors 40, 41, 42 and 43. These resistors are coupled in a generally Wheatstone bridge configuration as shown in FIG. 3. Each of the four resistors has equal nominal resistance and, in the presently preferred embodiment, comprises a platinum alloy, specifically platinum which includes 3% tungsten. Other metals, such as tantalum, may be used as the strain gage material. The general serpentine pattern of each resistor is formed from 0.5 mil wide lines of this strain gage alloy separated by 0.5 mil wide spaces. The outer serpentine pattern of resistors 41 and 42 is approximately 15 mils wide; the inner pattern of resistors 40 and 43 is approximately 30 mils wide.

One end of resistors 40 and 41 is connected to a contact pad 36; the other end of resistor 41 is connected to pad 35. The other end of resistor 40 and one end of resistor 42 are connected to pad 38. The other end of resistor 42 and one end of resistor 43 are connected to pad 37. Pad 34 is connected to the other end of resistor 43. All the pads and the lines interconnecting the pads and resistors are gold formed on the surface 49 of sensor 48, as will be explained in greater detail. All the pads and lines include a border 44 of the underlying strain gage metal. An output signal is obtained between pads 36 and 37. Pad 38 is coupled to a fixed potential and pads 34 and 35 are coupled to ground through resistors 26 and 27, respectively.

Figure 5:
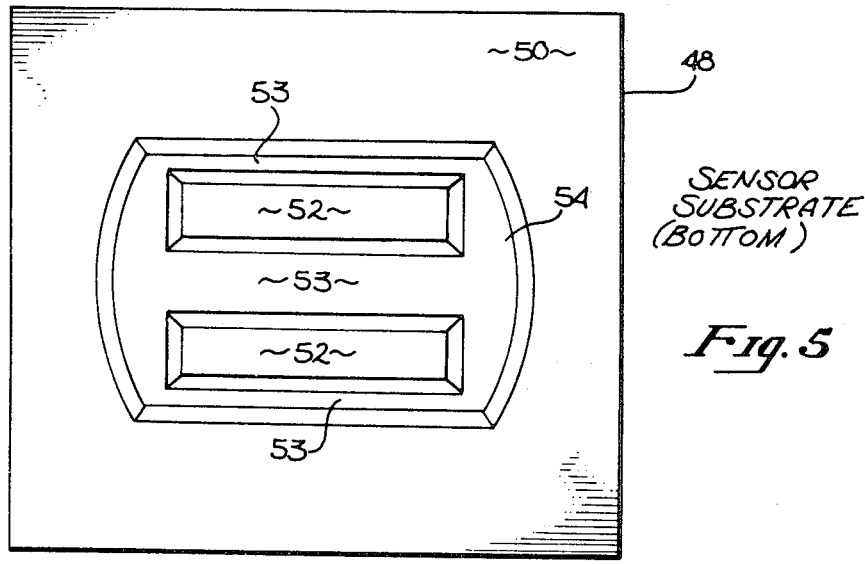
FIG. 5 is a plan view of the bottom surface of the sensor of FIG. 4.
Figure 8:
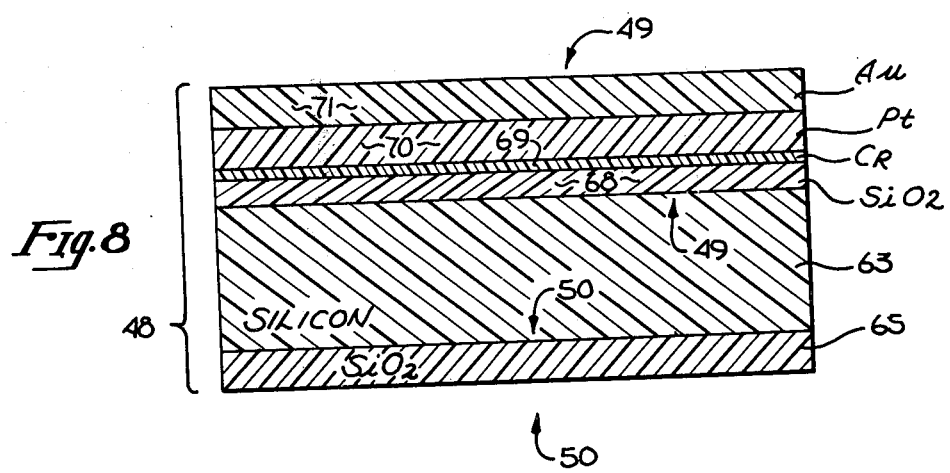
FIG. 8 is a cross-sectional elevation view of a silicon substrate with several layers on its surfaces. This substrate, after processing, forms the sensor (strain gage resistors and diaphragm) of the invented transducer.

The surface 50 of sensor 48 is etched to form the generally, centrally disposed recess 54 and the mesas 52 FIG. 5). Thus the intermediate substrate areas 53 between these mesas and between the mesas and the recess 54 are thinner as may also be seen in FIG. 7. The formation of this structure shall be discussed in greater detail in conjunction with FIGS. 8 and 9.

FIGS. 8 through 11 illustrate various steps used in the fabrication of the sensor 48. The sensor substrate 63, in the presently preferred embodiment, is a monocrystalline silicon material 9-11 mils thick. This material is not employed for its usual semiconductor properties, thus grades of silicon not suitable for semiconductor processing may be employed. The silicon is used since it has excellent spring-like characteristics with very low hysteresis, making it ideal for a strain gage force collector or diaphragm. Moreover, the silicon is easily processed with well-developed semiconductor technology.

The fabrication process simultaneously fabricates a plurality of sensors on a single wafer as is commonly done in the fabrication of integrated circuits. In the following description, the processing of only a single substrate is discussed. It will be obvious to one skilled in the art, however, that the steps are performed for the entire wafer and that the wafer is then "diced" into separate "chips" or substrates.

After well-known cleaning and laping steps, 10,000 A of SiO$_2$ is grown (in a wet atmosphere) on surfaces 49 and 50 of the substrate 63. These are shown as layers 65 and 68 of FIG. 8. Then, on surface 49, a chromium layer 69 of approximately 100 A is sputtered onto the SiO$_2$ layer 68. This metal layer is used since it adheres to the SiO$_2$ layer and since the platinum alloy layer 20 will adhere to it. Thus other materials which serve this function may be employed.

The active strain gage resistors are formed from the platinum alloy layer 70. In the presently preferred embodiment, this strain gage material layer comprises platinum with 3% tungsten. This layer 70, which is approximately 400 A thick, is sputtered onto layer 64, although other well-known means may be employed to deposit this layer.

A gold layer 71 which is approximately 1 micron thick is next formed on layer 70 by sputtering or other well-known means.

A photoresist mask is next formed on the surface 50 of substrate 63 to define the pattern shown best in FIG. 5. This pattern includes the recess 54 with the two mesas 52 which are disposed within the recess 54. Well-known photolithographic techniques may be employed. Then the SiO$_2$ layer 65 is etched with a known etchant. A hot KOH etchant is next employed to etch the substrate 63 to form the thin areas 53 (FIG. 9). In the presently preferred embodiment, a 10 molar solution at 65° C. etches the silicon substrate at a rate of 1 mil/hr. This slow etching allows the dimension 60 (FIG. 9) to be controlled to the desired dimension; for example, for one pressure range this dimension is 0.5 mils.

On the surface 49, the pattern of the serpentine-shaped resistors 40, 41, 42 and 43 are etched into (and through) the gold layer 71. This is done by forming the resistor pattern (in a negative form) with the photoresist and then etching the gold with an aquaregia based gold etching solution. This masking and etching step is also used to define the border 44 (FIG. 4). The results of this etching are shown by gaps 73 in FIG. 9. Note that the resistors are formed over the thin substrate regions, areas 53. Next, an important step of diffusing the gold in the platinum alloy occurs. (The gold also diffuses into the chromium layer 69.) This is done, in the presently preferred embodiment, by maintaining the substrate at 225°-600° C. for approximately 30 minutes. This diffusion, which is shown graphically in FIG. 9 by wavy lines in the layer 70, allows the platinum layer to be chemically etched in a subsequent step. This solves the problem of etching platinum in the presence of other metals.

After this diffusion, a photoresist mask is formed on the gold layer 71 to define the leads and contact pads, specifically pads 34 through 38 of FIG. 4, and the leads interconnecting these pads with the active strain gage resistors. Note these leads are defined within the borders 44 (FIG. 4). In FIG. 10, for sake of simplicity, the pads and leads are shown only at the photoresist 75a. The photoresist defined at this time, in the presently preferred embodiment, covers the resistor pattern etched into the gold as shown by photoresist 75b.

Now the gold is etched with an aquaregia solution to define the pads and leads. Because of the previous diffusion steps, the exposed gold "doped" platinum is also etched by the same solution at the same time. The resulting structure is shown in FIG. 11 after removal of the photoresist. This structure includes the platinum alloy resistors and gold covered pads and leads shown, by way of example, at 77 surrounded by the borders 44. The borders 44 prevent undercutting of the gold leads and pads during this etching. Note that the platinum alloy resistors and borders 44 are formed since the resistors and borders have not been "doped" with gold.

Figure 6:
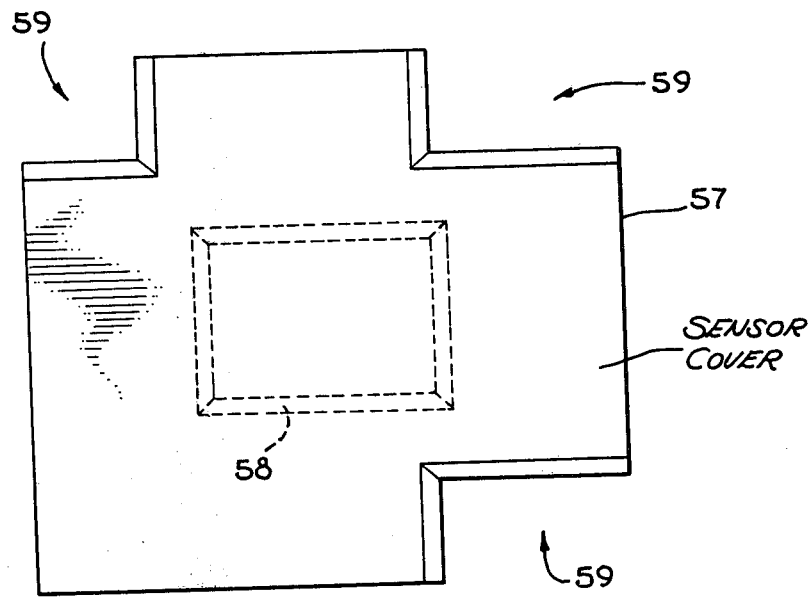
FIG. 6 is a plan view of the cover for the sensor substrate.

Referring now to FIG. 6, the sensor cover 57 is fabricated from a silcon body employing known semiconductor techniques. A plurality of such covers are formed simultaneously from the same wafer. The corners 59 of the silicon body are etched completely through such that when the cover engages the sensor, the underlying pads of the sensor substrate are accessable. This is shown best in FIG. 1. A recess 58 is etched into one surface of the cover 57 as best shown in FIG. 7. The active strain gage resistors are disposed within this recess.

In one embodiment of the invention, the substrate 63 is etched such that the dimension 60 is 0.5 mils. This thickness is used for a pressure gage having a range to 15 psi. At this pressure, a deflection of 0.5 mils occurs and provides an output voltage of 5 millivolts. As previously mentioned, because of the mesas 52, substantially all of the deflection occurs at the thinner areas 53. By confining the deflection to these areas, as is known in the prior art, improved linearity and sensitivity are obtained. For another pressure range (200 psi), the dimension 60 of FIG. 9 is 1.0 mil. Again, for a deflection of 0.5 mils, an output of 5 millivolts is obtained.

Figure 1:
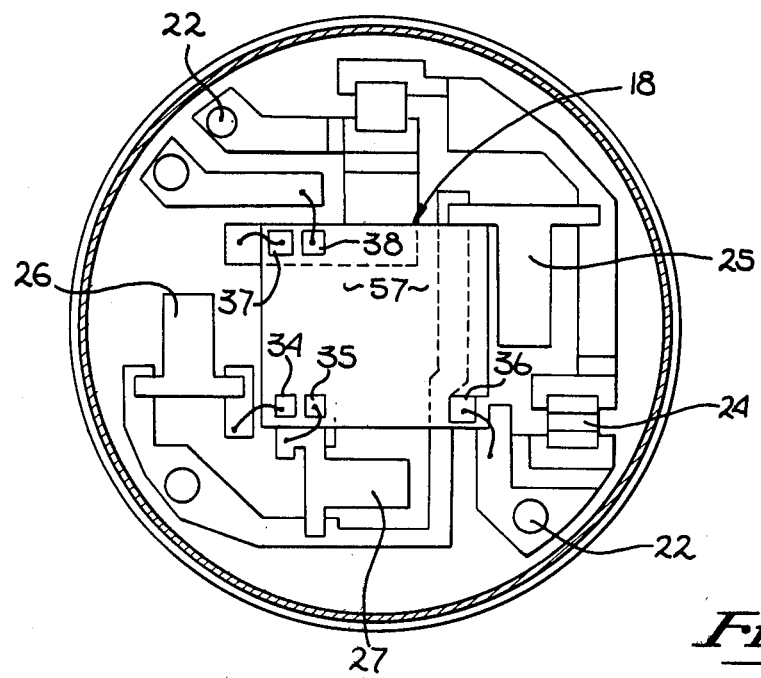
FIG. 1 is a plan view of the invented transducer mounted in a package, the cover of the package is removed in this view.
Figure 2:
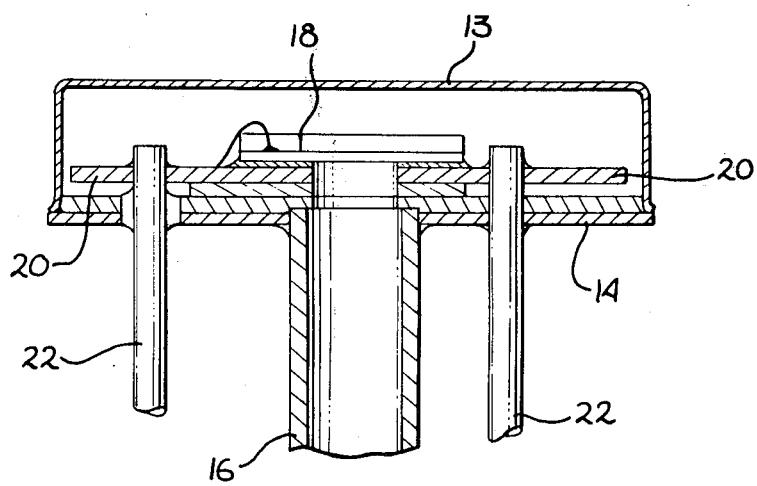
FIG. 2 is a cross-sectional elevation view of the package (with cover) of FIG. 1.

After the sensor assembly 18 is assembled, it may be mounted in a plurality of different packages. In the presently preferred embodiment, a standard package such as a TO-8 package, shown in FIGS. 1 and 2, is used. This package includes a generally annular-shaped header 14 and a cover 13. The sensor assembly 18 is mounted on a ceramic substrate 20. An aperture is disposed through this substrate to allow the vacuum tube 16 to communicate with the sensor (surface 50). A silicon rubber adhesive is used, in the presently preferred embodiment, to mount the sensor assembly to the ceramic substrate 20. The pads 34, 35, 36, 37 and 38 are connected to the pins 21 through leads, and in some cases through resistors, as will be explained.

Referring to FIGS. 1 and 3, the pad 37 is connected to ground through the resistors 24 and 25. The pads 34 and 35 are also coupled to ground through resistors 26 and 27, respectively. The resistors 24, 25, 26 and 27 are external to the sensor assembly 18, as best shown in FIG. 1. These resistors are employed for calibration purposes. After the sensor assembly is mounted in the package, it is tested and the necessary values of the resistors are calculated. Depending on the results of this testing, the resistors 24 and 25 may be coupled to the pad 36 rather than the pad 37. In the presently preferred embodiment, the resistor 24 is a selectable resistor chip in the range of 100K-2 megohms. The resistor 25 is laser trimmable over a range of approximately 200 Kohms. The resistors 26 and 27 are selected from a range of between 200 to 2 Kohms. By adjusting the value of these resistors in a well-known manner, the transducer is calibrated.

While the strain gage transducer described above has been shown in conjunction with a pressure transducer, it will be obvious that the invention may be used with other transducers. For example, a mass may be coupled to the silicon substrate to provide an accelerometer. Or, two different metals may be employed for the legs of the strain gage resistors to provide a temperature-sensitive device.

Thus, a transducer has been disclosed which has the advantage of the metal strain gage-type transducers however, which may be manufactured empolying the less expensive semiconductor processing techniques.

We claim:

1. A strain gage transducer comprising:
   a monocrystalline silicon substrate having a first and second surface;
   a silicon dioxide layer disposed on said first surface of said silicon substrate;
   a plurality of platinum alloy strain gage resistors formed on said silicon dioxide layer;
   a plurality of gold leads disposed over said silicon dioxide layer interconnecting said resistors;
   whereby a low cost, high performance transducer is realized.

2. The transducer defined by claim 1 wherein said substrate defines mesas on said second surface, such that the areas of said substrate between said mesas are thinner, said areas generally underlying said resistors.

3. The transducer defined by claim 2 wherein said resistors and leads form a Wheatstone bridge circuit.

4. The transducer defined by claim 3 including a cover covering said resistors and hermetically sealing them.

5. The transducer defined by claim 4 wherein said cover comprises a silicon member sealed to said first surface of said substrate.

* * * * *